(12) United States Patent
Sun et al.

(10) Patent No.: US 10,495,691 B2
(45) Date of Patent: Dec. 3, 2019

(54) SYSTEM ARCHITECTURE METHOD AND APPARATUS FOR ADAPTIVE HARDWARE FAULT DETECTION WITH HARDWARE METRICS SUBSYSTEM

(71) Applicant: NXP USA, Inc., Austin, TX (US)

(72) Inventors: Xiao Sun, Austin, TX (US); Wen Chen, Austin, TX (US); Jayanta Bhadra, Austin, TX (US)

(73) Assignee: NXP USA, Inc., Austin, TX (US)

(*) Notice: Subject to any disclaimer, the term of this patent is extended or adjusted under 35 U.S.C. 154(b) by 36 days.

(21) Appl. No.: 15/893,485

(22) Filed: Feb. 9, 2018

(65) Prior Publication Data

US 2019/0250210 A1   Aug. 15, 2019

(51) Int. Cl.

| G01R 31/3187 | (2006.01) |
|---|---|
| G01R 31/3183 | (2006.01) |
| G06F 11/27 | (2006.01) |
| G01R 31/317 | (2006.01) |
| G11C 29/44 | (2006.01) |
| G11C 29/12 | (2006.01) |
| G11C 29/56 | (2006.01) |

(52) U.S. Cl.
CPC ... *G01R 31/3187* (2013.01); *G01R 31/31724* (2013.01); *G01R 31/318364* (2013.01); *G06F 11/27* (2013.01); *G11C 29/44* (2013.01); *G11C 29/56008* (2013.01); *G11C 2029/1208* (2013.01)

(58) Field of Classification Search
CPC .......... G01R 31/3187; G01R 31/31724; G01R 31/318364; G06F 11/27; G11C 29/44; G11C 2029/1208; G11C 29/56008

USPC ........................................................ 714/733
See application file for complete search history.

(56) References Cited

U.S. PATENT DOCUMENTS

| 7,472,051 B2 * | 12/2008 | Mariani ................. G06F 11/27 703/13 |
|---|---|---|
| 7,870,454 B2 * | 1/2011 | Gorman ................. G11C 29/40 714/719 |
| 7,945,823 B2 | 5/2011 | Doddamane et al. |
| 8,612,089 B2 | 12/2013 | Harata |
| 8,813,061 B2 | 8/2014 | Hoffman et al. |
| 10,303,460 B2 * | 5/2019 | Fox ..................... G06F 11/1433 |

(Continued)

OTHER PUBLICATIONS

Cadence Design Systems, Inc., Automotive Is a Pot of Gold Guarded by a Dragon, printed Oct. 20, 2017.

(Continued)

*Primary Examiner* — James C Kerveros

(57) ABSTRACT

A method, system, and architecture (100) for adaptively field testing for hardware faults on an integrated circuit device includes a central quality assurance server (121) which receives specified hardware metric data (131) monitored at an integrated circuit device (110) in the field, identifies prioritized built-in self-test (BIST) fault detection tests (134) based on the specified hardware metric data, securely downloads the prioritized BIST fault detection tests (132) to the integrated circuit device for execution to identify a first hardware fault at the integrated circuit device, and then receives diagnosis information (133) identifying the first hardware fault from the integrated circuit device which is used to update the prioritized BIST fault detection tests.

20 Claims, 4 Drawing Sheets

(56) References Cited

U.S. PATENT DOCUMENTS

| | | | | |
|---|---|---|---|---|
| 2002/0077782 A1* | 6/2002 | Fruehling | ............ | G06F 11/1008 |
| | | | | 702/185 |
| 2005/0278595 A1* | 12/2005 | Anzou | ................ | G01R 31/3187 |
| | | | | 714/733 |
| 2006/0028891 A1* | 2/2006 | Selva | ...................... | G11C 29/16 |
| | | | | 365/222 |
| 2007/0038911 A1* | 2/2007 | Koenemann | ...... | G01R 31/31703 |
| | | | | 714/732 |
| 2008/0077835 A1* | 3/2008 | Khoche | ............. | G01R 31/31724 |
| | | | | 714/733 |
| 2014/0325463 A1 | 10/2014 | Bahadra et al. | | |
| 2018/0129769 A1* | 5/2018 | Martirosyan | ......... | G11C 29/835 |

OTHER PUBLICATIONS

NXP, Future Advanced in Body Electronics, AMPG Body Electronics Systems Engineering Team, BODYDELECTRWP Rev. 0, https://www.nxp.com/docs/en/white-paper/BODYDELECTRWP.pdf, 2013.

Carles Hernandez et al., LiVe: Timely Error Detection in Light-Lockstep Safety Critical Systems, Design Automation Conference (DAC), 2014 51st ACM/EDAC/IEEE, Jun. 1-5, 2014.

Oscar Ballan et al., Verification of Soft Error Detection Mechanism through Fault Injection on Hardware Emulation Platform, 2010 International Conference on Dependable System and Networks Workshops (DSN-W), Jun. 28-Jul. 1, 2010.

\* cited by examiner

SYSTEM ARCHITECTURE METHOD AND APPARATUS FOR ADAPTIVE HARDWARE FAULT DETECTION WITH HARDWARE METRICS SUBSYSTEM

BACKGROUND OF THE INVENTION

Field of the Invention

The present invention is directed in general to field of integrated circuit testing and functional safety. In one aspect, the present invention relates to a method, apparatus and system for in-field hardware fault detection of automotive system-on-chip circuits.

Description of the Related Art

With system-on-chip (SoC) circuits, it is important to test the circuit performance at manufacture and also during normal or in-field operation. For example, automotive SoCs have stringent requirements for resilience against random hardware faults, and thus need to be verified as fault tolerant, both at manufacture and in the field. Existing approaches for ensuring reliability and safety of such systems should go hand-in-hand with functionality verification. One approach is to re-use simulation results generated during functional verification for safety verification testing, such as by running a fault list against a fault injection campaign to generate a failure modes, effects, and diagnostic analysis (FMEDA) report of the subsystem/product level failure rates, failure modes and diagnostic capability. To this end, the fault injection campaign should be linked to receive the functional verification tests when generating the FMEDA report to make the fault campaign more realistic as opposed to doing a blind fault campaign. Unfortunately, fault injection campaigns are very computation-intensive processes, requiring months of resource-intensive testing, including register-transfer level (RTL) and/or gate level simulation (GLS) for faults. Due to resource limitations, the fault campaign might not even be exhaustive and might miss some corner cases. Fault injection campaign testing can also require a significant number of tests that cannot be readily deployed in field to perform fault detection, particularly when the in-field device has resource limitations, such as limited memory or processing resources.

While testing can be performed at manufacture, such tests can only capture performance or design defects before field deployment, and may not detect latent defects or performance-related problems that arise during the field operation of the product (e.g., aging effects), thereby posing functional safety concerns. Built-in self test (BIST) or built-in test (BIT) circuits and/or design-for-testing techniques are often included to provide a mechanism for the SoC circuit to test itself to meet performance requirements (e.g., high reliability or lower repair cycle times) or constraints (e.g., limited technician accessibility or test costs during manufacture), thereby decreasing the cost of relying on external (pattern-programmed) test equipment. However, BIST and design for testing (DFT) methods cannot achieve 100% fault coverage due to the limited storage of test patterns on-chip, and are usually not targeted to detect multiple-point latent faults. Thus, there are special challenges with performing in-field fault detection since, even after an SOC is qualified at manufacture site, there is no system architecture to provide in-field diagnosis and/or to apply known diagnosis results to in-field screening of the SOC. As seen from the foregoing, the existing fault detection solutions are extremely difficult at a practical level by virtue of the challenges with quickly and efficiently performing in-field testing to detect faults, especially when operating conditions over the life the SoC circuits can introduce aging effects, the unique & non-creatable in-field environment and other static and dynamic performance changes that require lifetime testing and updates or corrections that are costly and complex to provide.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

An adaptive hardware fault detection apparatus, system, architecture, and methodology are described for enabling in-field diagnosis and screening of hardware faults by providing system-on-chip (SoC) devices with hardware monitor subsystems for collecting hardware metrics which are used to optimize and improve effectiveness of fault campaign testing based on actual detection results and feedback of detection hints as well as to provide proactive testing capability to SoC devices in the field. In selected example embodiments, an architecture, system, and methodology are provided for use with a simulation-based fault campaign which uses hardware metrics to prioritize the tests that are run in the simulation-based fault campaign, thereby speeding up fault detection for a fault list. In other example embodiments, an architecture, system, and methodology are provided that may be used with emulation-based fault campaigns to provide machine self-learning capability to adaptively test SoC devices in the field for hardware faults and to learn from the results to optimize and improve effectiveness based on actual fault detection results and feedback of detection hints. In such embodiments, hardware metrics can be synthesized as hardware logic on the emulation platform for use in collecting data from the functional emulation of the SoC device. Based on the collected data, tests can be prioritized for running a fault campaign in emulation, categorized into detection look up directories, and uploaded to one or more secure quality assurance (QA) servers. With access to the secure QA server(s), SoC devices in the field can run the highly ranked tests for Built-In Self-Test via LRE (Load Run Execute) to periodically detect if there are any faults. In addition or in the alternative, secure wireless connections, such as Over the Air (OTA), can be used to collect fault logging and hardware metrics from in-field SoC devices and to generate on-demand tests for download and testing of the in-field SoC devices with results being reported to the secure QA server(s). By providing a machine self-learning capability for adaptively testing SOCs in field by collecting hardware metrics in the field and learning from the results to optimize and improve effectiveness based on actual detection results and feedback of detection hints as well as to provide proactively testing capability in field, significant reductions in the time required to run a fault campaign (e.g., a 58% reduction in test time) can be achieved, thereby enabling the continuous improvement of product quality in the field while reducing costs associated with hardware fault detection.

Figure 1:
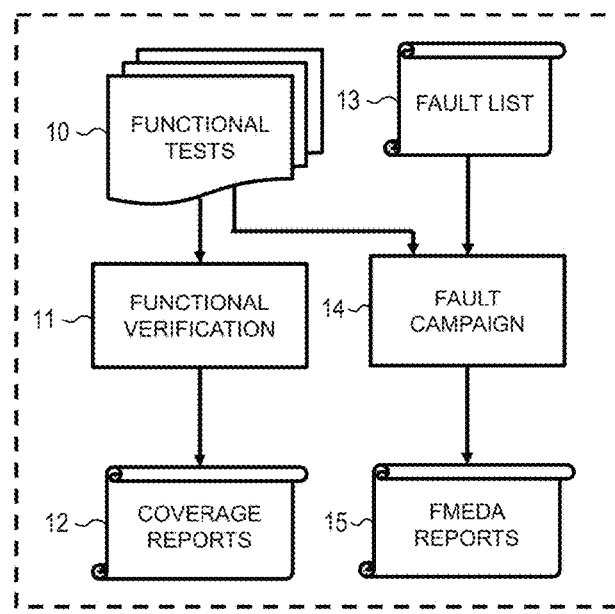
FIG. 1 is a simplified depiction of a conventional design verification flow which combines functional verification and safety verification by using functional tests for input to a fault injection campaign.

To provide additional details for an improved understanding of selected embodiments of the present disclosure, reference is now made to FIG. 1 which is a simplified depiction of a conventional design verification flow 10-15 in which functional verification steps 10-12 and functional safety verification steps 13-15 are performed to verify or validate an SoC device design with a process wherein the functional tests 10 are input to both the functional verification 11 and the functional safety verification 14. In particular, the functional tests 10 provide a set of stimuli/tests that are input to the functional verification process 11 which simulates the SoC design to verify that the SoC under test achieves its specified functionality, albeit without taking into account the presence of random hardware faults. After simulation in the functional verification process 11, coverage reports 12 are generated which identify the design areas and functionalities that are covered in simulation 11. The coverage reports 12 are used as a measure of verification completeness. The functional tests 10 are also used with the functional safety verification steps 13-15 which are performed to verify that the SoC device can achieve the specified functionality in the presence of random hardware (HW) faults. For example, functional safety verification may be carried out by injecting a list of faults 13 into the SoC device design and then simulating the faulty design with the fault injection campaign process 14 to generate a report 15 (e.g., failure modes, effects, and diagnostic analysis (FMEDA) report) of the subsystem/product level failure rates, failure modes and diagnostic capability. By linking the fault injection campaign process 14 to also receive the functional verification tests 10 when generating the FMEDA report 15, the results of the fault injection campaign 14 will be more realistic, but will require substantial computing resources and time to perform testing with RTL/GLS fault simulation, and might not even be exhaustive in failing to test for corner cases or random hardware faults.

Figure 2:
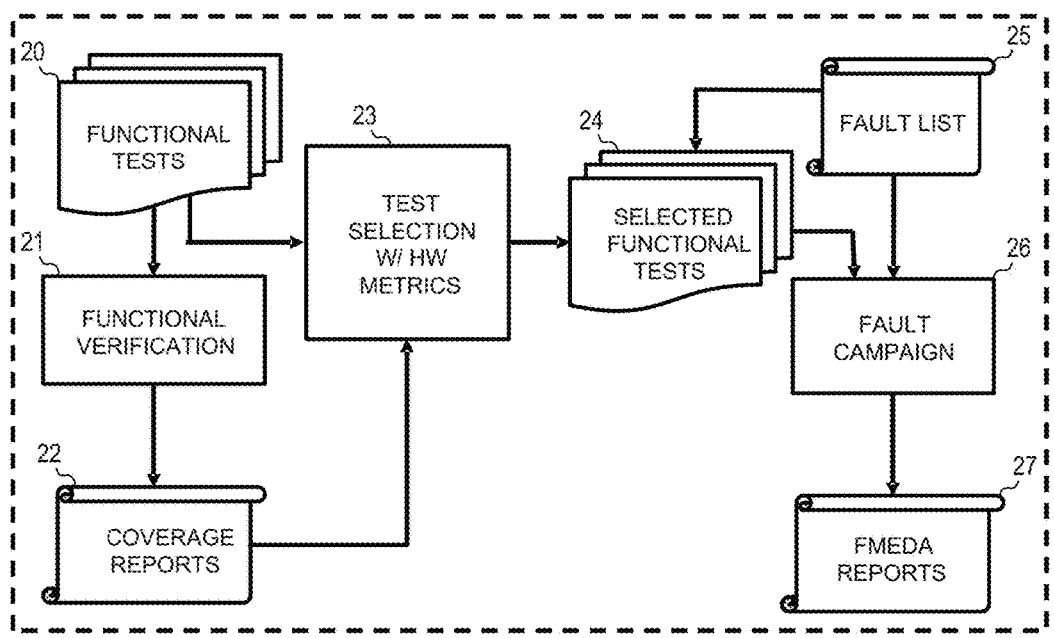
FIG. 2 is a simplified depiction of a design verification flow which combines functional verification and safety verification to reduce simulation, emulation, and/or BIST time by using hardware metrics to select and rank functional tests for input to a fault injection campaign in accordance with selected embodiments of the present disclosure.

To address these and other limitations from conventional fault testing approaches, reference is now made to FIG. 2 which depicts a simplified illustration of a design verification flow 20-27 which combines functional verification and safety verification by using hardware metrics to select and rank functional tests for input to a fault injection campaign in accordance with selected embodiments of the present disclosure. As depicted, the functional verification steps 20-22 and functional safety verification steps 25-27 are implemented in substantially the same way, respectively, as the functional verification testing steps 10-12 and functional safety verification steps 13-15 shown in FIG. 1, except that the functional tests 20 are ranked or sorted with selection step 23 using specified hardware metrics to generate a prioritized list of functional tests 24 for input to the fault injection campaign process 26. As a result, the inputs to the fault campaign 26 include a fault list 25 of the faults of interest, a prioritized list of functional tests 24, and the SoC design (not shown). Processing these inputs, the fault campaign 26 evaluates each fault from the list fault list 25 against the prioritized functional tests 24 to identify whether any of the prioritized functional tests 24 can detect the fault when the fault 25 is injected into the SoC design. In operation, each fault from the fault list 25 is first injected into the SoC design, and then one functional test is selected from the prioritized list of functional tests 24 to simulate the faulty design. If a mismatch between the faulty design behavior and the good design behavior can be observed, a fault is detected by the selected functional test, and there is no need to continue to simulate other functional tests to detect this fault. However, if the fault is not detected, then additional functional tests should be simulated to see if this fault can be detected. If all functional tests cannot detect the fault, then this fault is considered not detected.

In contrast to the conventional approach shown in FIG. 1 for sequentially selecting functional tests 10 for the fault campaign 14, the use of hardware (HW) metrics to select and rank functional tests at step 23 for the prioritized list of functional tests 24 allows the highly ranked functional tests to be simulated first. To this end, the information to calculate the HW metrics for each functional test comes from the simulation coverage reports 22 which contain information regarding the activities invoked by each functional test in simulation. Since the highly ranked tests have higher chances of detecting faults, the required simulation time in the fault campaign 26 can be significantly reduced by using the HW metrics to select and rank the functional tests at step 23.

To illustrate the effectiveness of using hardware metrics to prioritize the application of verification tests in a fault injection campaign, an example fault campaign which injects 195 detectable faults for a SoC device and applies 127 functional tests would execute 1501 fault simulations, requiring 6.14 days of simulation time in a single test machine. However, by using a hardware metric which monitors the count of full toggle events at the output ports to prioritize the functional tests to run for each fault based on the metric, the number of fault simulation is reduced to only 652 simulations, resulting in an improved fault simulation time on a single machine of 2.56 days—a 58% reduction.

In the foregoing discussion, the HW metrics can be used to prioritize the functional tests 20 to run for simulation-based fault campaign 26 to speed up fault detection for a list of faults 25. However, it will be appreciated that a similar approach may be used for an emulation-based fault campaign 26, with the major difference being that, in emulation, the coverage information (from functional verification coverage reports 22) for calculating HW metrics is not readily available. To address this, hardware metric monitor circuits may be designed and synthesized into the emulation platform for collecting the required coverage information. And for BIST operation at the SoC device, the highly ranked tests 24 which are generated from the HW metrics from the simulation and/or emulation based fault campaigns may be re-used.

Figure 3:
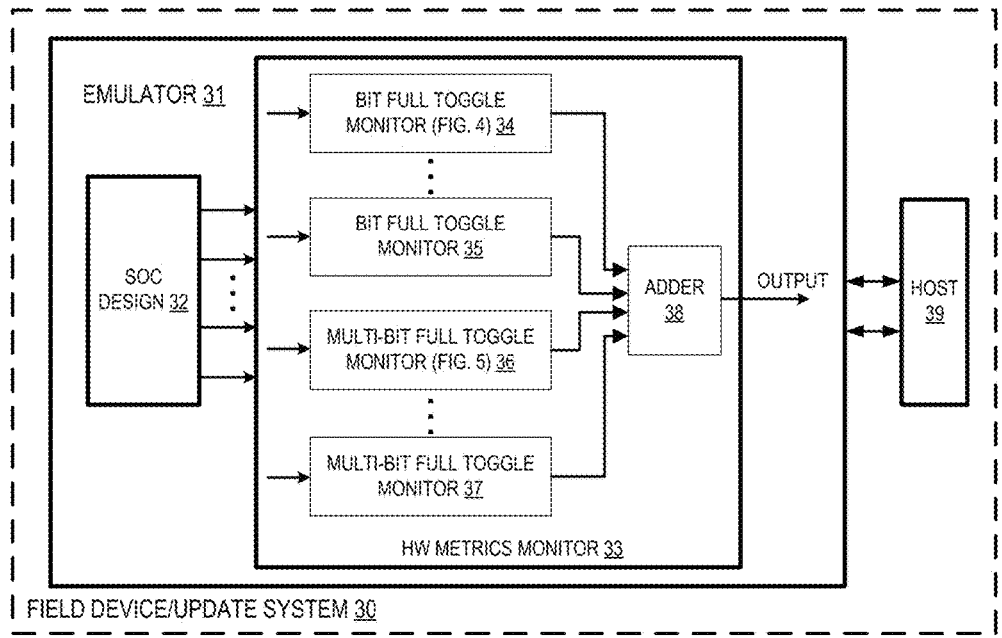
FIG. 3 depicts a simplified block diagram of a fault detection acceleration system for field update with a hardware metrics monitor synthesized in an emulation platform in accordance with selected embodiments of the present disclosure.

To provide illustrative details for an example hardware metrics monitor circuit in accordance with selected embodiments of the present disclosure, reference is now made to FIG. 3 which depicts a simplified block diagram of a fault detection acceleration system for field update 30 in which a host processor device 39 is connected to an emulator platform 31 in which an SoC design 32 and hardware metrics monitor 33. Thus embodied, the hardware metrics monitor 33 monitors and collects hardware metrics from the SoC design 32 for each functional test run on the emulator platform 31. Using the collected hardware metric, the functional tests can be prioritized to be run during the fault campaign conducted on the emulation platform 31. Each hardware metric monitor 33 is a hardware-implemented circuit for calculating specified hardware metrics that may be used to detect hardware faults in the SoC design 32.

To provide an example of hardware metrics that are monitored, the HW metrics monitor 33 may be connected to a safety-critical design block in the SoC design 32 to monitor the "full toggle" status of one or more output ports, such as a single-bit output port or a multi-bit output port. The reason for choosing to monitor the full toggle of the output port as a HW metric is that a full toggle indicates that the test invokes high activity in the circuit. In normal operation, each output port will fully toggle between "0" and "1" values, indicating that there are no permanent hardware faults at the port and that the functional test invokes a lot of activity in the circuit. In particular, the normal operation of a single-bit output port would have a bit signal that fully toggles during simulation of a functional test (e.g., the bit signal rises (0→1) and falls (1→0) during the simulation). However, with a hardware fault, either or both of the bit signal transitions would not fully toggle. For a multiple-bit output port, if every bit of the port is fully toggled, then this port is fully toggled. Otherwise, a hardware fault is indicated at the multiple-bit output port. Thus, an example HW metric for a functional test is the number of output signals from the SoC design 32 that have been fully toggled during simulation of the test. This metric indicates the amount of activities that the functional test invoked. Usually, the higher the number of activities invoked by the test, the higher the probability that the test is going to detect a fault if the fault is present.

In an example configuration, the depicted hardware metrics monitor 33 includes one or more single-bit full toggle monitors 34, 35, each having an input connected to corresponding signal-bit output port from the SoC design 32 and an output connected to the adder circuit 38. Each single-bit full toggle monitor 34, 35 is used to detect if a bit-signal from its monitored single-bit output port is fully toggled. In addition, the hardware metrics monitor 33 may also include one or more multiple-bit full toggle monitor 36, 37, each having inputs connected to multiple-bit output ports from the SoC design 32 and an output connected to the adder circuit 38. Each multiple-bit full toggle monitor 36, 37 is used to detect if the bit-signals from its monitored multi-bit output ports are fully toggled. With the outputs from the full toggle monitors 34-37 accumulated together at an adder circuit 38 (e.g., logical AND gate), the output of the HW monitor 33 (OUTPUT) will be set (e.g., "1") only if full toggle monitors 34-37 indicate that every monitored port from the SoC design 32 is fully toggled.

Figure 4:
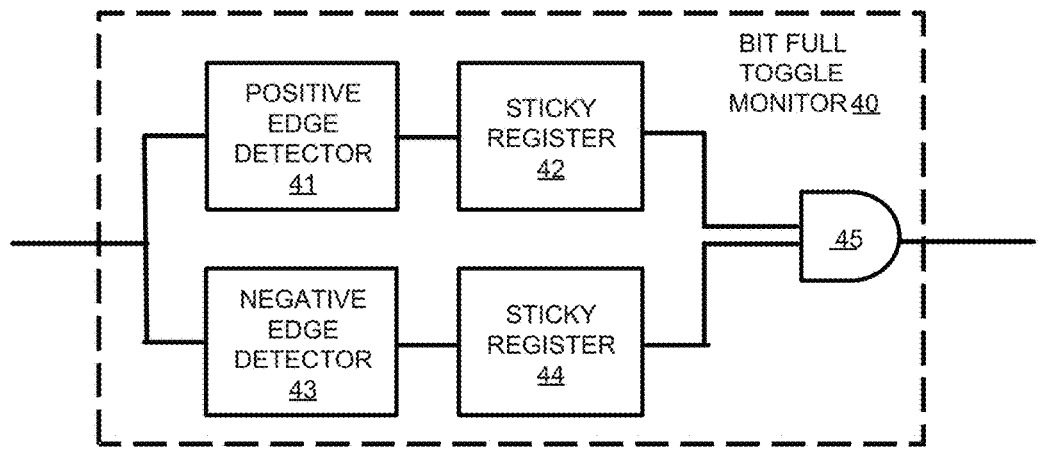
FIG. 4 depicts a first hardware monitor embodied as a bit full toggle monitor in accordance with selected embodiments of the present disclosure.

While any suitable hardware design may be used to implement the hardware monitor circuits disclosed herein, reference is now made to FIG. 4 which depicts a first hardware monitor 40 embodied as a single-bit full toggle monitor in accordance with selected embodiments of the present disclosure. In the disclosed bit full toggle monitor 40, the input from the monitored single-bit output port is connected to a positive edge detector 41 and to a negative edge detector 43. With the positive edge detector 41, any rise of an input single-bit signal that is detected causes the output of the positive edge detector 41 to be set when such a rise is detected. Similarly, the negative edge detector 43 is connected to detect the fall of an input single-bit signal which causes the output of the negative edge detector 43 to be set when such a fall is detected. Captured by the sticky registers 42, 44, the outputs from the positive edge detector 41 and negative edge detector 43 are supplied to the AND gate 45, so the output of the signal-bit toggle monitor 40 will be set (or "1") only if both a positive and negative edge signal transition are detected, thereby indicating that the single-bit signal is fully toggled.

Figure 5:
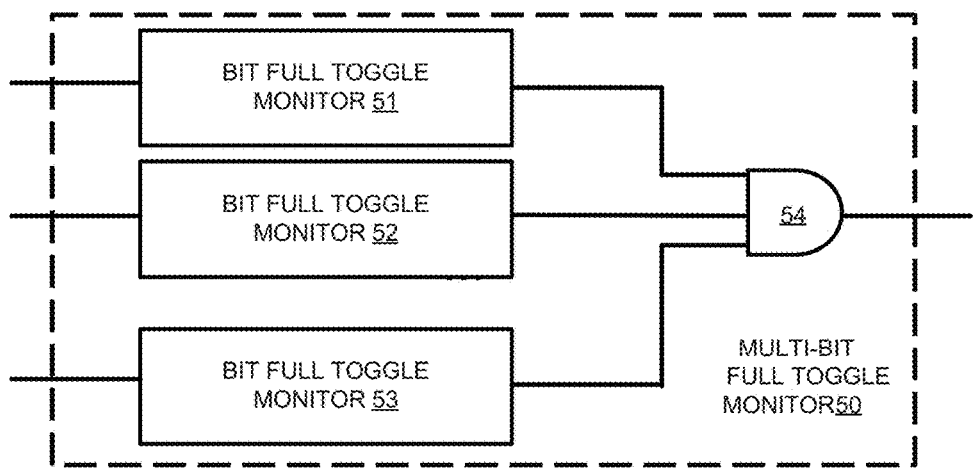
FIG. 5 depicts a second hardware monitor embodied as a multi-bit full toggle monitor in accordance with selected embodiments of the present disclosure.

Another example of a suitable hardware design is shown in FIG. 5 which depicts a second hardware monitor 50 embodied as a multi-bit full toggle monitor in accordance with selected embodiments of the present disclosure. In the disclosed multi-bit full toggle monitor 50, the inputs from the monitored multi-bit output ports are respectively connected to corresponding inputs of the bit full toggle monitors 51-53. As will be appreciated, the design of each single-bit full toggle monitor (e.g., 51) may correspond to the disclosed bit full toggle monitor 40 shown in FIG. 4. With each bit full toggle monitor e.g., 51), any full toggle of the single-bit input being monitored (e.g., having both positive and negative edge signal transitions) will cause the output of the bit full toggle monitor to be set. With the outputs from the bit full toggle monitors 51-53 being supplied to the AND gate 54, the output of the multi-bit toggle monitor 50 will be set (or "1") only if every monitored single-bit output is fully toggled.

As disclosed herein, a system architecture may deploy hardware metrics monitors on SoC devices, such as automotive SoC devices in the field, to improve hardware fault detection by capturing specified hardware metrics from in-field SoC device(s) for use in prioritizing the functional tests to run for a simulation-based fault campaign, thereby speeding up fault detection for a fault list. In addition to improving fault simulation performance, the ability to capture specified hardware metrics from in-field SoC devices enables adaptive field testing of SoC devices which can exploit machine self-learning to optimize and improve the effectiveness of built-in self-testing (BIST) based on actual hardware fault detection results, thereby continuously improving the quality of products in the field while reducing costs associated therewith. The ability to conduct in-field SoC device testing is important because there is no guaranty that a perfectly functional SoC device at the manufacturing facility will continue to operate normally in the field, so there is an ongoing need to continuously reconfirm safety and operation of the SOC device before use. This ability to adaptively detect hardware faults is especially valuable for SoC devices, such as automotive microcontrollers, that are exposed to harsh operating environments and that require constant assurance of operational readiness. While error-correcting code (ECC) protected memory can be used to recover a single bit error in memory, such techniques will not protect against multiple bit failures in memory or logic failures. With the example of an automotive microcontroller, there is a window of opportunity to test all the safety critical components before engine is turned on by periodically running functional test programs to detect if there are any faults or soft errors as part of the Built-In Self-Test (BIST) that are downloaded from a secure server over a communication link to the in-field SoC device. But with limited storage space at the SoC device for the test programs, there is a need to prioritize which test programs are downloaded. In accordance with selected embodiments of the present disclosure, the HW metric-based test selection techniques provide a viable approach for selecting the functional test programs for BIST, where the hardware metrics may be collected and processed at a central location, such as by using a pull mode (where in-field SoC devices request tests) or a push mode (where tests for known problems are proactively distributed to in-field SoC devices).

Figure 6:
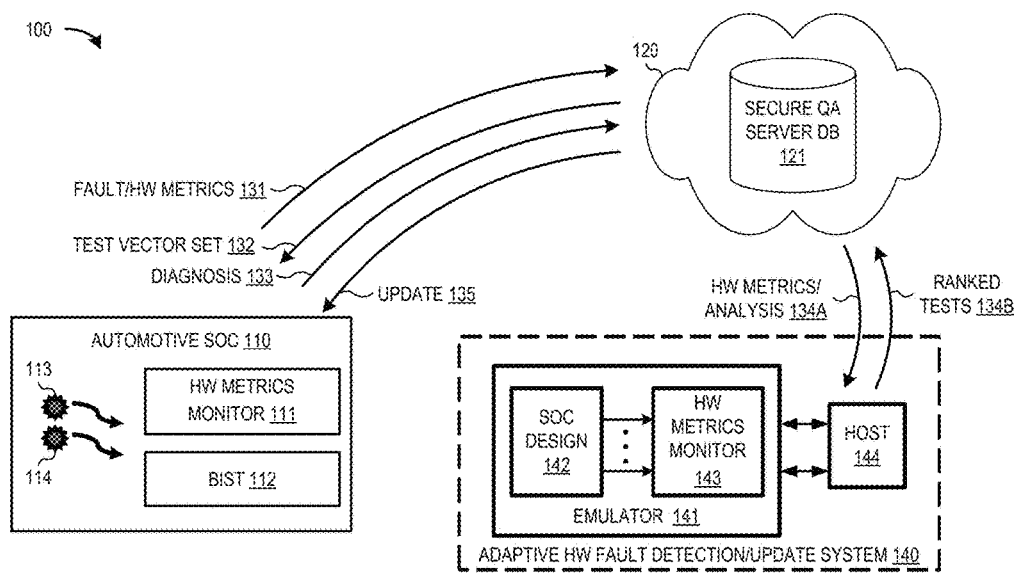
FIG. 6 depicts an on-demand in-field test architecture which employs machine self-learning to generate ranked functional BIST tests from hardware metrics in accordance with selected pull mode embodiments of the present disclosure.

To provide additional details for an improved understanding of selected embodiments of the present disclosure, reference is now made to FIG. 6 which diagrammatically depicts a system architecture 100 for an adaptive hardware fault detection and update system 140 connected over a secure network server database 120 to one or more automotive SoC devices 110 which run functional BIST tests to detect hardware faults 113, 114 at the automotive SoC device 110. In the disclosed system architecture 100, a "pull mode" is used to assemble on-demand functional BIST tests at the automotive SoC device 110. To this end, the automotive SoC device 110 may include a hardware metrics monitor 111, included as part of a Fault Collection & Control Unit (FCCU), which is configured to monitor defined hardware metrics for detecting one or more hardware faults 113, 114. Upon detecting a hardware fault 113, 114, the hardware metrics monitor 111 can send a fault information message 131 which includes the collected hardware metrics to a secure quality assurance (QA) server/database 121 which may be located in the cloud 120. At the QA server 121, the collected hardware metrics are processed as fault detection hints to identify a test vector set 132 that is targeted to the detected problem and returned to the automotive SoC device 110. For example, the QA server 121 may query the QA database to find a best fit fault detection test set 132 for the problem and detection hints received. In addition or in the alternative, the test vector set 132 may be retrieved from a set of ranked tests that are generated from simulation and/or emulation-based processing of hardware metrics at the adaptive hardware fault detection and update system 140. And using a secure wireless connection (such as OTA (Over The Air)), the test vector set 132 may be downloaded to the automotive SoC 110 where the downloaded test vector set is executed by the BIST test module 112 to detect the fault(s) 113, 114, and the resulting diagnosis information 133 is fed back to the secure QA server 121.

In addition, the captured hardware metrics and analysis from the QA server are conveyed via messaging link 134A to the adaptive hardware fault detection and update system 140 which employs machine self-learning to generate ranked functional BIST tests 134B from the captured hardware metrics for use with future on-demand field testing. In particular, the additional hardware metrics 131 collected from the automotive SoC device 110 may be added to the hardware metrics monitor 143 which is synthesized with the SoC design 142 in the emulator 141. Under control of the host 144, the adaptive hardware fault detection and update system 140 provides a machine self-learning capability to adaptively generate ranked. BIST tests 134B based on the defined hardware metrics that can be accumulated from simulation and emulation and stored in the secure QA server database 121. In turn, the secure QA server database 121 uses a secure OTA wireless connection to convey the ranked tests as updates 135 to the automotive SOC device 110, thereby learning from the monitored hardware metrics to optimize and improve test effectiveness based on actual detection results and feedback of detection hints.

Figure 7:
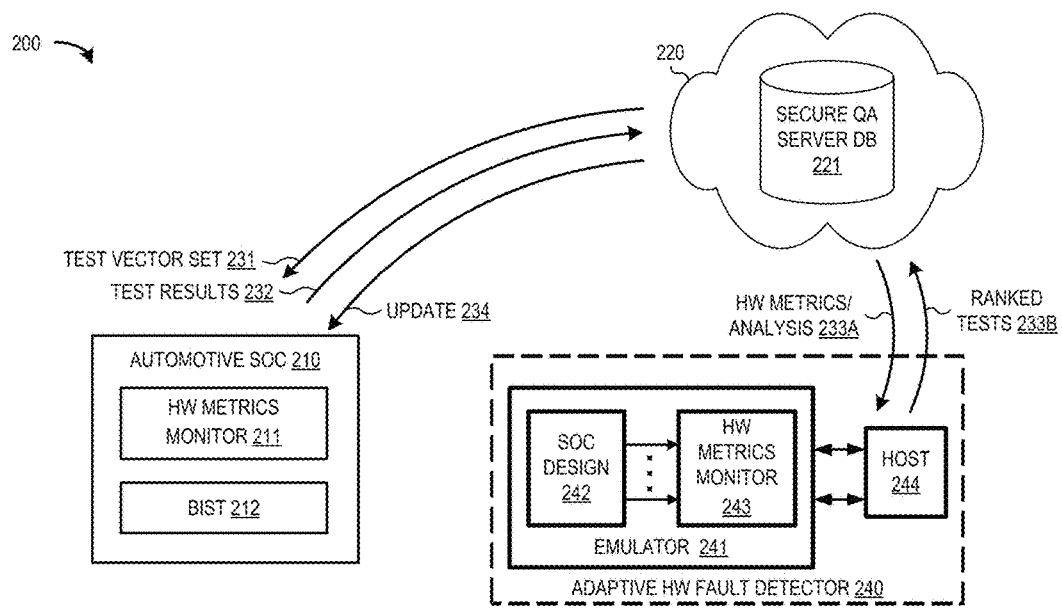
FIG. 7 depicts an on-demand in-field test architecture which employs machine self-learning to generate ranked functional BIST tests from hardware metrics in accordance with selected push mode embodiments of the present disclosure.

To provide additional details for an improved understanding of selected embodiments of the present disclosure, reference is now made to FIG. 7 which diagrammatically depicts a system architecture 200 for an adaptive hardware fault detection and update system 240 connected over a secure network server database 221 to one or more automotive SoC devices 210 which run functional BIST tests to proactively detect hardware faults at the automotive SoC device 110. In the disclosed system architecture 200, a "push mode" is used to assemble on-demand functional BIST tests at the automotive SoC device 210 which includes a BIST test module 212 and which may also include a hardware metrics monitor 211 embodied in the Fault Collection & Control Unit (FCCU) and configured to monitor defined hardware metrics for detecting hardware faults at the SoC device 210. Instead of being prompted by detection of a hardware fault at the SoC device 210, the secure quality assurance (QA) server/database 221 located in the cloud 220 may be configured to proactively download one or more test vector sets over a secure OTA wireless connection 231 to the automotive SoC device 210 that are targeted to one or more known problems. As described herein, the test vector set 231 may be retrieved from a set of ranked tests that are generated from simulation and/or emulation-based processing of hardware metrics at the adaptive hardware fault detection and update system 240. At the automotive SoC device 210, the downloaded test vector set is executed by the BIST test module 212 to detect hardware faults, and the resulting test result information 232 is fed back to the secure QA server 221.

The QA server 221 conveys the test results and any collected hardware metrics or analysis via messaging link 233A to the adaptive hardware fault detection and update system 240 which employs machine self-learning to generate ranked functional BIST tests 233B for use with future on-demand field testing. In particular, the test results 232, including any additional hardware metrics collected from the automotive SoC device 210, may be added to the hardware metrics monitor 243 which is synthesized with the SoC design 242 in the emulator 241. Under control of the host 244, the adaptive hardware fault detection and update system 240 provides a machine self-learning capability to adaptively generate ranked BIST tests 233B which are provided as updates 234 to the automotive SOC device 210 by learning from the results to optimize and improve effectiveness based on actual detection results and feedback of detection hints.

As seen from the foregoing, limitations associated with conventional fault campaign detection schemes are remedied by disseminating prioritized. BIST tests which are ranked based on monitored hardware metrics to provide for periodic testing of in-field SoC devices. In particular, it will be appreciated that conventional fault campaigns often qualify the safety mechanism against single-point faults so that detection and recovery of multiple point faults is not guaranteed. For example, a 2-point fault which consists of a HW fault and a soft error might not be recovered by a conventional safety mechanism that is executed during operation. However, if the HW fault can be detected and recovered before operational time by using the prioritized BIST tests as disclosed herein, it is much easier for the safety mechanism to deal with only the single soft error. In this example, it can be seen that the system architecture may use the "pull mode" to learn about hardware faults from in-field SoC devices, and may use the "push mode" to apply the tests to detect faults and/or to apply this knowledge to detect multiple faults, thereby providing a continuous improvement in the quality of in-field SOC devices over time. As will be appreciated, the "push mode" can be accomplished without using the "pull mode" as a prerequisite.

Figure 8:
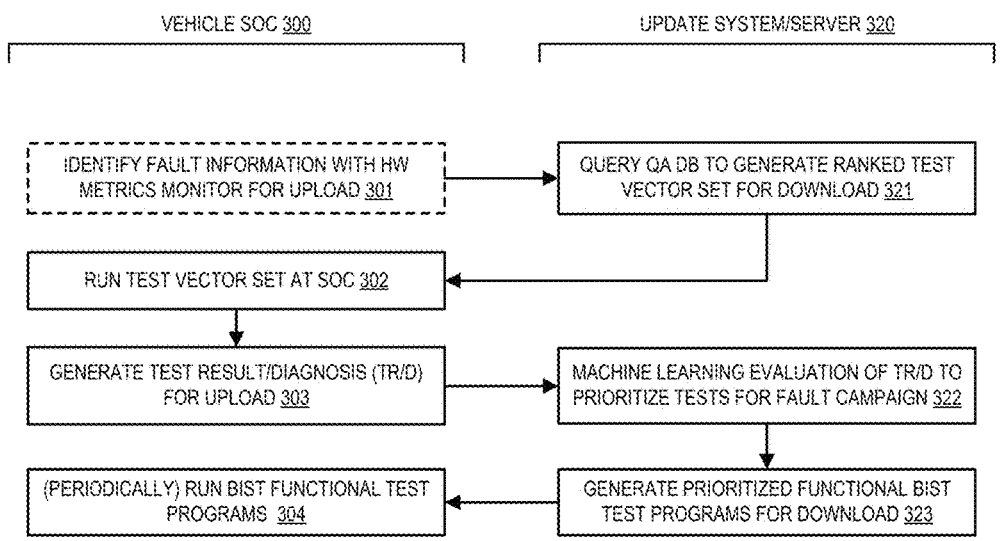
FIG. 8 illustrates simplified flow chart sequence for adaptively performing fault testing SoCs in the field in accordance with selected embodiments of the present disclosure.

To provide additional details for an improved understanding of selected embodiments of the present disclosure, reference is now made to FIG. 8 which depicts a simplified flow chart sequence for adaptively performing fault testing SoCs in the field in accordance selected embodiments of the present disclosure. In the depicted example embodiments, the control logic and methodology shown in FIG. 8 may be implemented in a vehicle system-on-chip (SoC) 300 and update system/server 320 as shown with a combination of hardware and software that is executed on one or more host computing systems, processors, or microcontroller units that includes processor and memory for storing programming control code. Thus implemented, the specified sequence of operations are performed to adaptively generate and prioritize fault detection tests at the update system/server 320 during simulation or emulation based on monitored hardware metrics. Once generated, the prioritized fault detection tests are securely downloaded to the vehicle SOC 300 where they are periodically run during BIST to collect hardware fault data for upload to the update system/server 320.

In FIG. 8, the method starts at step 301 when the vehicle SOC 300 identifies fault information, such as by using hardware metrics monitors to detect hardware faults on the vehicle SOC 300. As indicated by the dashed lines, step 301 may be included in any "pull mode" embodiments for periodically requesting fault detection tests upon detecting a hardware fault at the vehicle SOC 300. However, with "push mode" embodiments disclosed herein, the step 301 may be omitted.

Upon uploading the detected fault information to the update system/server 320, a ranked test vector set is generated at step 321, such as by querying a secure quality assurance database which stores fault detection tests. In selected embodiments, the ranked test vector set may be retrieved from a set of ranked tests that are generated from simulation and/or emulation-based processing of hardware metrics at the adaptive hardware fault detection and update system. In other embodiments, the ranked test vector set is generated by a host machine and emulator in which the SOC and hardware metric monitor are synthesized to provide a machine self-learning capability to adaptively generate fault detection tests by learning from the hardware metric results collected in the field to optimize and improve test effectiveness.

At the vehicle SOC 300, the ranked test vector set is downloaded and run at step 302. In selected embodiments, the ranked test vector set is run by a built-in self-test (BIST) controller so as to detect hardware faults and assure operational readiness before a car key is turned on. In other embodiments, the ranked tests can be used in Functional Built-In Self-Test (BIST) via LRE (Load Run Execute) after download over a secure communication link to memory in the vehicle SOC 300. In addition, BIST can be run periodically to ensure detection of any faults or soft errors. To account for limited storage space at the vehicle SOC 300, the ranked test vectors that are downloaded may be limited to a specified number of tests that are selected and ranked based on monitored hardware metrics.

At step 303, the vehicle SOC 300 generates the test results and/or diagnosis (TR/D) for upload to the update system/server 320. At this point, the update system/server 320 essentially loops back to generate a new set of ranked tests, but may do so by applying machine self-learning techniques at step 322 to evaluate the test results/diagnosis for updating the functional verification tests used for the fault injection campaign. At step 323, the update system/server 320 generates prioritized functional BIST test programs for download to one or more vehicle SOCs 300 where they may be periodically run to detect hardware faults (step 304).

By now it should be appreciated that there has been provided an apparatus, method, program code, and system for adaptively field testing for hardware faults on an integrated circuit device, such as an automotive system-on-chip (SoC) device. In the disclosed embodiments, specified hardware metric data monitored at the integrated circuit device is sent to a central server system. In selected embodiments, the specified hardware metric data is monitored on the integrated circuit device with a hardware metric monitor that monitors full toggle transitions of one or more bit signals at the integrated circuit device. In such embodiments, the full toggle transitions of one or more bit signals are accumulated at an adder in the hardware metric monitor to generate the specified hardware metric data. Based on the received specified hardware metric data, the central server system identifies one or more prioritized built-in self-test (BIST) fault detection tests. In selected embodiments, the prioritized BIST fault detection tests are generated by emulating and/or simulating a defined circuit on the integrated circuit device. In other embodiments, the prioritized BIST fault detection tests may be identified by querying a data base to find the prioritized BIST fault detection tests based on the specified hardware metric data. Once identified, the prioritized BIST fault detection tests may be securely downloaded to the integrated circuit device, such as by using an over-the-air communication channel from the central server system to the integrated circuit device. At the integrated circuit device, the prioritized BIT fault detection tests are executed to generate diagnosis information which identities a first hardware fault at the integrated circuit device. In selected embodiments, the prioritized BIT fault detection tests are executed at a BIST controller on the integrated circuit device which is configured to load, run and execute the prioritized BIST fault detection tests. Upon receiving the diagnosis information from the integrated circuit device, the central server system updates the prioritized BIST fault detection tests based on the diagnosis information identifying the first hardware fault. In selected embodiments, the central server system uses machine self-learning to update the one or more prioritized BIST fault detection tests based on the diagnosis information received from the integrated circuit device.

In another form, there is provided a fault detection metrics device, method, program code, and system for detecting hardware faults in a system-on-chip (SoC) device which may, in selected embodiments, be embodied as an on-vehicle fault device for detecting whether or not there has occurred a hardware fault in the SoC device. As disclosed, the fault detection metrics device includes one or more inputs connected to one or more corresponding output ports of a design block under test, such as a safety-critical design block. In addition, the fault detection metrics device includes an output connected to provide a first signal if no hardware fault is detected on the design block under test and to provide a second signal if a hardware fault is detected on the design block under test. Connected between the one or more inputs and output, a hardware metrics monitor circuit is configured to monitor the one or more inputs for specified hardware metrics for each of one or more functional tests run on the design block under test. To this end, the hardware metrics monitor circuit may include one or more monitoring circuits for monitoring specified hardware metrics at the one or more inputs. In selected embodiments, the hardware metrics monitor circuit is connected to monitor specified hardware metrics by detecting full toggle bit signals at the one or more inputs. For example, the monitoring circuits may include a single-bit full toggle monitor circuit connected over one of the one or more inputs to a single output port from the design block under test, and/or may include a multi-bit full toggle monitor circuit connected over the one or more inputs to a plurality of output ports from the design block under test. In other embodiments, the multi-bit full toggle monitor circuit may include a plurality of single-bit full toggle monitor circuits, each connected over one of the one or more inputs to a different output port from the design block under test. The hardware metrics monitor circuit may also include an evaluation circuit connected to the one or more monitoring circuits for generating the first signal if no hardware fault is detected on the design block under test and for generating the second signal if a hardware fault is detected on the design block under test. In selected embodiments, the evaluation circuit may include a combinatorial logic structure for logically combining outputs from the one or more monitoring circuits to generate the first and second signals.

In still yet other embodiments, there is disclosed a data processing system, device, method, and program code embodied in a memory coupled to a processor which is configured to verify functional safety of a system-on-chip (SoC) device against hardware faults by performing a sequence of steps. Initially, the processor is configured to receive, from the SoC device in the field, specified hardware metric data monitored at the SoC device. In addition, the processor is configured to prioritize, at the data processing system, one or more built-in self-test (BIST) fault detection tests based on the specified hardware metric data. The processor may also be configured to securely download, from the data processor, one or more prioritized BIST fault detection tests to the SoC device for execution to identify a first hardware fault al the SoC device. In addition, the processor may be configured to receive, from the SoC device in the field, diagnosis information generated by the one or more prioritized BIST fault detection tests to identify the first hardware fault. In selected embodiments, the specified hardware metric data is monitored at a hardware metric monitor on the SoC device which monitors full toggle transitions of single-bit signals at the SoC device. In other embodiments, the specified hardware metric data is monitored at a hardware metric monitor on the SoC device which monitors full toggle transitions of multi-bit signals at the SoC device. In other embodiments, the full toggle transitions of single-bit signals are accumulated at an adder in the hardware metric monitor to generate the specified hardware metric data.

Although the described exemplary embodiments disclosed herein are directed to methods and systems for adaptively field testing for hardware faults on a system-on-chip device, the present invention is not necessarily limited to the example embodiments illustrate herein, and various embodiments of the circuitry and methods disclosed herein may be implemented with other devices and circuit components. For example, various embodiments may be implemented in whole or in part with hardware and/or software to provide a fault detection metrics device which ranks BIST tests based on HW metrics to speed up fault campaign in emulation and/or simulation, which provides on-demand testing from over-the-air updates, and which accumulates BIST test result data to a secure QA server for use in updating and ranking the BIST tests. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:
1. A method of adaptively field testing for hardware faults on an integrated circuit device, comprising:
  receiving, from an integrated circuit device in the field, specified hardware metric data monitored at the integrated circuit device;

identifying, at a fault detection/update system, one or more prioritized built-in self-test (BIST) fault detection tests based on the specified hardware metric data;

securely downloading the one or more prioritized BIST fault detection tests to the integrated circuit device for execution to identify a first hardware fault at the integrated circuit device;

receiving, from the integrated circuit device in the field, diagnosis information identifying the first hardware fault; and updating, at the fault detection/update system, the one or more prioritized BIST fault detection tests based on the diagnosis information identifying the first hardware fault.

2. The method of claim 1, where the specified hardware metric data is monitored at a hardware metric monitor on the integrated circuit device which monitors full toggle transitions of one or more bit signals at the integrated circuit device.

3. The method of claim 2, wherein the full toggle transitions of one or more bit signals are accumulated at an adder in the hardware metric monitor to generate the specified hardware metric data.

4. The method of claim 1, wherein identifying one or more prioritized BIST fault detection tests comprises querying a data base to find the one or more prioritized BIST fault detection tests based on the specified hardware metric data.

5. The method of claim 1, wherein the integrated circuit device comprises an automotive system-on-chip (SoC) device which comprises a BIST controller configured to load, run and execute the one or more prioritized BIST fault detection tests.

6. The method of claim 1, wherein securely downloading the one or more prioritized BIST fault detection tests comprises using an over-the-air communication channel from the fault detection/update system to the integrated circuit device.

7. The method of claim 1, wherein the one or more prioritized BIST fault detection tests are generated by emulating and/or simulating a defined circuit on the integrated circuit device.

8. The method of claim 1, wherein the fault detection/update system uses machine self-learning to update the one or more prioritized BIST fault detection tests based on the diagnosis information received from the integrated circuit device.

9. A system for detecting hardware faults in a system-on-chip (SoC) device, comprising:
one or more inputs connected to one or more corresponding output ports of a design block under test;
an output connected to provide a first signal if no hardware fault is detected on the design block under test and to provide a second signal if a hardware fault is detected on the design block under test; and
a hardware metrics monitor circuit connected to monitor the one or more inputs for specified hardware metrics for each of one or more functional tests run on the design block under test, the hardware metrics monitor circuit comprising:
one or more monitoring circuits for monitoring specified hardware metrics at the one or more inputs, and
an evaluation circuit connected to the one or more monitoring circuits for generating the first signal if no hardware fault is detected on the design block under test and for generating the second signal if a hardware fault is detected on the design block under test.

10. The system of claim 9, wherein the SoC device is embodied as an on-vehicle fault device for detecting whether or not there has occurred a hardware fault in the SoC device.

11. The system of claim 10, wherein the design block under test comprises a safety-critical design block on the SoC device.

12. The system of claim 9, wherein the hardware metrics monitor circuit is connected to monitor specified hardware metrics by detecting full toggle bit signals at the one or more inputs.

13. The system of claim 12, wherein the one or more monitoring circuits comprises a single-bit full toggle monitor circuit connected over one of the one or more inputs to a single output port from the design block under test.

14. The system of claim 12, wherein the one or more monitoring circuits comprises a multi-bit full toggle monitor circuit connected over the one or more inputs to a plurality of output ports from the design block under test.

15. The system of claim 13, wherein the multi-bit full toggle monitor circuit comprises a plurality of single-bit full toggle monitor circuits, each connected over one of the one or more inputs to a different output port from the design block under test.

16. The system of claim 9, where the evaluation circuit comprises a combinatorial logic structure for logically combining outputs from the one or more monitoring circuits to generate the first and second signals.

17. A data processing system comprising a memory and a processor coupled to the memory, wherein the processor is configured to verify functional safety of a system-on-chip (SoC) device against hardware faults by:
receiving, from the SoC device in the field, specified hardware metric data monitored at the SoC device;
prioritizing, at the data processing system, one or more built-in self-test (BIST) fault detection tests based on the specified hardware metric data;
securely downloading the one or more prioritized BIST fault detection tests to the SoC device for execution to identify a first hardware fault at the SoC device; and
receiving, from the SoC device in the field, diagnosis information generated by the one or more prioritized BIST fault detection tests to identify the first hardware fault.

18. The data processing system of claim 17, where the specified hardware metric data is monitored at a hardware metric monitor on the SoC device which monitors full toggle transitions of single-bit signals at the SoC device.

19. The data processing system of claim 17, where the specified hardware metric data is monitored at a hardware metric monitor on the SoC device which monitors full toggle transitions of multi-bit signals at the SoC device.

20. The data processing system of claim 18, wherein the full toggle transitions of single-bit signals are accumulated at an adder in the hardware metric monitor to generate the specified hardware metric data.

* * * * *